US008667431B1

(12) United States Patent
Douskey et al.

(10) Patent No.: US 8,667,431 B1
(45) Date of Patent: Mar. 4, 2014

(54) TEST COVERAGE OF INTEGRATED CIRCUITS WITH MASKING PATTERN SELECTION

(71) Applicant: International Business Machines Corporation, Armonk, NY (US)

(72) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/785,109

(22) Filed: Mar. 5, 2013

Related U.S. Application Data

(63) Continuation of application No. 13/733,248, filed on Jan. 3, 2013.

(51) Int. Cl.
*G06F 17/50* (2006.01)
*G06F 11/22* (2006.01)

(52) U.S. Cl.
USPC .......................................... 716/52; 716/136

(58) Field of Classification Search
USPC ................................................... 716/52, 136
See application file for complete search history.

(56) References Cited

U.S. PATENT DOCUMENTS

| 2007/0130489 | A1 | 6/2007 | Kiryu et al. |
| 2008/0077833 | A1 | 3/2008 | Motika et al. |
| 2009/0089636 | A1 | 4/2009 | Fernsler et al. |
| 2011/0214026 | A1* | 9/2011 | Rajski et al. .................. 714/726 |
| 2011/0231719 | A1 | 9/2011 | Kim et al. |
| 2011/0307750 | A1* | 12/2011 | Narayanan et al. ........... 714/729 |
| 2012/0278672 | A1* | 11/2012 | Sinanoglu ..................... 714/726 |
| 2013/0035891 | A1* | 2/2013 | Maruyama .................... 702/119 |

FOREIGN PATENT DOCUMENTS

EP 1113279 A2 7/2011
WO 2010058248 A1 5/2010

OTHER PUBLICATIONS

Das, D and Touba, N., "Reducing Test Data Volume Using External/LBIST Hybrid Test Patterns", ITC International Test Conference Proceedings, 2000, Published by IEEE, 2000, pp. 115-122. © 2000 IEEE. DOI: 10.1109/TEST.2000.894198.

* cited by examiner

*Primary Examiner* — Suresh Memula
(74) *Attorney, Agent, or Firm* — Jonathan V. Sry; Robert R. Williams

(57) ABSTRACT

A method of locating faulty logic on a semiconductor chip is disclosed. The method may include determining failure rates for the semiconductor chip, which contain one or more logic elements. The method also may include determining a masking pattern using failure rates. The masking pattern may mask less than all of the logic elements using a determination method. The method may also include applying a test vector to a selected logic element, wherein the result from a test vector is compared to a reference.

10 Claims, 7 Drawing Sheets

TEST COVERAGE OF INTEGRATED CIRCUITS WITH MASKING PATTERN SELECTION

CROSS-REFERENCE TO RELATED APPLICATIONS

This application is a continuation of co-pending U.S. patent application Ser. No. 13/733,248, filed Jan. 3, 2013. The aforementioned related patent application is herein incorporated by reference in its entirety.

TECHNICAL FIELD

Embodiments described herein generally relate to electronic components, and more specifically, to testing electronic components.

BACKGROUND

Digital Integrated Circuits (ICs) can be prone to defects introduced during a manufacturing process. To test for defects, a test vector may be introduced into scan channels and the result of the test vector that is applied to the digital IC scan channels may be measured. Digital IC testing systems may be designed so that an external input pin transmits directly to a scan channel, which tests the digital logic.

SUMMARY

Embodiments of the disclosure provide methods, and a system for locating faulty logic on a semiconductor chip.

One embodiment is directed to a method of locating faulty logic on a semiconductor chip. The method may include determining failure rates for the semiconductor chip, which contains one or more logic elements. The method also may include determining a masking pattern using failure rates. The masking pattern may mask less than all of the logic elements using a determination method. The method may include applying a test vector to a selected logic element, wherein the result from a test vector may be compared to a reference.

Another embodiment is directed to a method of locating faulty logic on a semiconductor chip. The method may comprise applying a test vector to a logic element of the semiconductor chip. The result from the test vector may be compared to a reference. The method may also comprise determining a masking pattern. The masking pattern may mask less than all of the logic elements. The method may comprise monitoring a failure rate on subsequent tested chips. The failure rate may determine the masking pattern.

Another embodiment is directed to a system for locating faulty logic on a semiconductor chip. The system may comprise one or more logic elements. The logic element may receive a test vector and outputs a test vector result. The system may also comprise a mask. The mask may be coupled to the logic element and controls the output based on a masking pattern. The system may also comprise a tester. The tester may determine the masking pattern, implement the masking pattern, and compare the test vector result to a reference.

BRIEF DESCRIPTION OF THE DRAWINGS

Embodiments are illustrated by way of example, and not by way of limitation, in the figures of the accompanying drawings in which like reference numerals refer to similar elements or steps.

DETAILED DESCRIPTION

Figure 1:
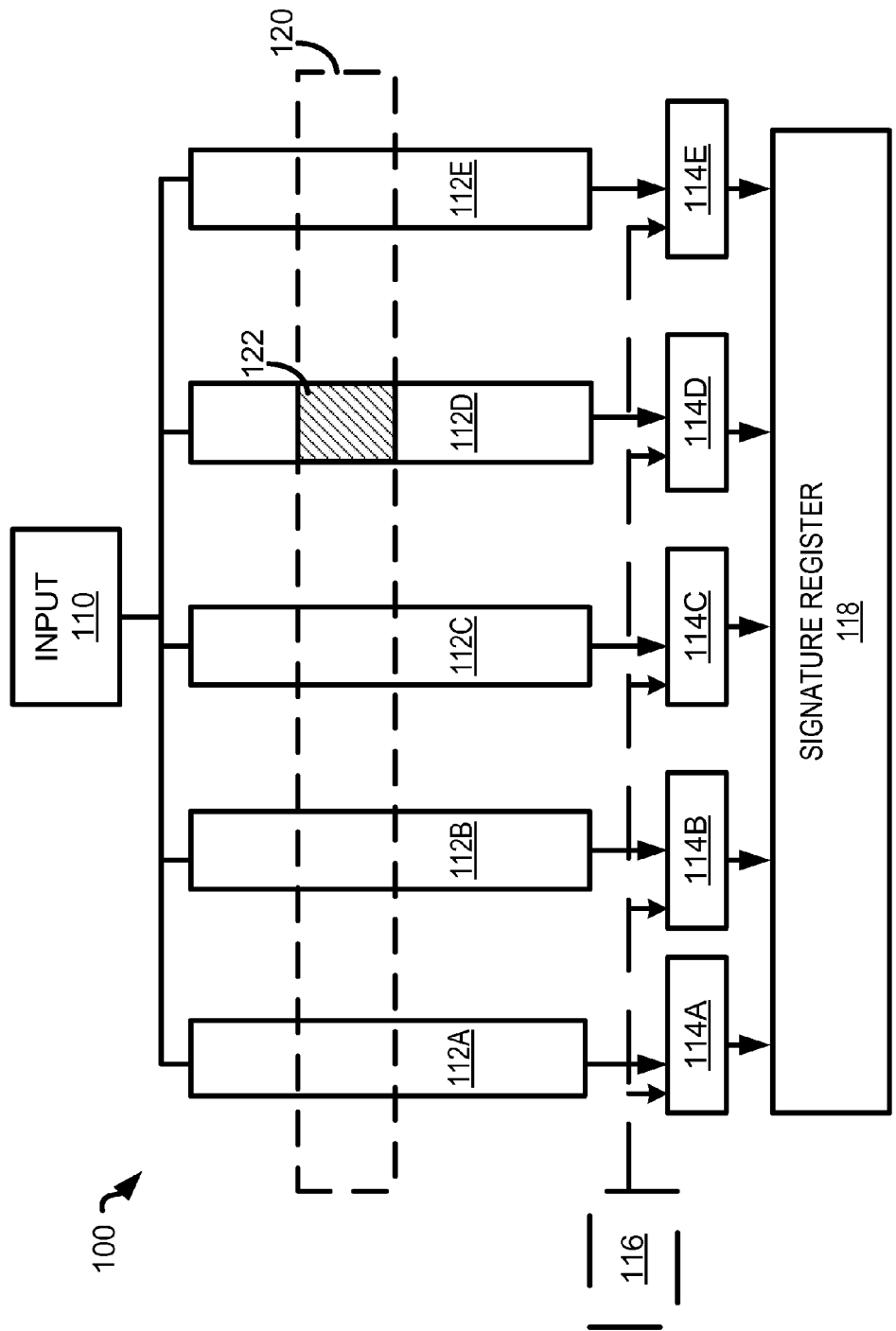
FIG. 1 illustrates the scanning of latches in a testing system on a particular scan channel, according to an embodiment.

A number of defects may be created during the manufacturing of a digital integrated circuit (IC). These defects may affect the logic output of the digital IC, which in turn adversely influences semiconductor chip quality and costs. Industry has developed a number of testing techniques to test for the defects. These techniques may rely on built in wires to transmit test vectors into the digital ICs via scan channels.

The scan channels may connect to individual scan latches. A test vector produces an output on the scan latches, which may be compiled into a signature register and then compared against a simulated, expected result for the digital IC being tested. The wires that transmit test vectors may be connected to input pins that receive test vectors from an external source such as a tester or internal source such as Logic Built In Self Test (LBIST). Testing from an external source may be performed through chip testers, which may have a high cost and operate at a high volume.

The signature register may indicate a passing IC or a non-passing IC but may provide inadequate information regarding a particular failing logic element, e.g., a single scan latch, or a scan channel. The term logic element may refer generically to a piece of logic being tested. In one embodiment, the piece of logic tested may be a scan latch and may be used interchangeably with the term logic element. In another embodiment, the piece of logic being tested may be a scan channel and may be used interchangeably with the term logic element. Knowing the source of a failing logic element may yield improvements to the manufacture of the IC.

A sweep may be a method of activating a mask to exclude logic elements from providing their test vector results into the signature register. Since the sweep method may depend on when the mask is activated, then the terms sweep and sweep method, may be used interchangeably with the term masking pattern. A sweep, or masking pattern, may occur with a number of runs. The runs may be defined by the number of times that a particular logic element is scanned in a given clock cycle. The term run may be used interchangeably with the term scan.

A single run may be defined as the result of a test vector input to one or more scan latches. A variety of sweeps, e.g., single-level, double-level, triple-level, and recursive binary sweeps, have been developed to compare logic elements from a good IC to logic elements from a bad IC to identify faults within the individual logic elements. The good IC may be used as a reference. The sweeps are described more fully in the discussion in FIG. 3. An embodiment may describe a method to optimally select through a variety of sweeps to identify the failing logic elements.

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed.

FIG. 1 shows an example of a scan system 100 that may use a masking technique to isolate failing logic elements according to an embodiment. The scan system may reside on an IC, such as a chip. The scan system 100 may receive a test vector from an input 110. The input 110 may be internal or external to the chip. An example of an internal input 110 may include a pseudo random pattern generator. An example of an external input 110 may include a scan data in (SDI) delivered through an external testing source. The test vector may produce a result in the underlying logic element of the chip.

The input 110 may be connected to one or more scan channels. The shown embodiment of a scan system 100 has 5 scan channels, 112A, 112B, 112C, 112D, and 112E (which may be generically referred to as 112), but any number of scan channels are contemplated. The scan channels 112 may include any number of logic elements, i.e., scan latches, (not pictured) to be tested. The scan channels 112 may cover different test regions on the chip.

The scan channels 112 may further couple to masks 114A, 114B, 114C, 114D, and 114E (which may be generically referred to as 114). The masks 114 may selectively deactivate or activate scan channels 112 based on a signal from a controller 116. For example, masks 114 may be OR gates. Controller 116 may put a "1" input to a particular mask 114 which will cause the particular mask 114 to drive a "1" to signature register 118 regardless of what the corresponding scan channel 112 inputs to the OR gate embodiment of a mask 114. Signature register 118 is often referred to in the art as a MISR (Multiple Input Signature Register). The controller 116 may be located on the chip or on an external tester, according to various embodiments. The connection between the controller 116 and masks 114 is depicted for representative purposes and may be connected or not connected to the masks 114. The masks 114 may further couple to a signature register 118.

The signature register 118 may compress all of the results from the scan channels 112 to indicate an overall good or bad chip. A good chip may be a chip with logic elements that produce results from test vectors that match an expected simulated result. The good chip may be further retained as a "golden" chip. A bad chip may be a chip that produces results that does not match a simulated result. The bad chip may be examined further according to some embodiments. The signature register 118 may compress data received from the logic elements.

The masks 114 may selectively allow the scan channels 112 to output test vector results from the logic elements to the signature register 118. For example, if the logic elements are targeted in the testing region 120, the controller 116 may first activate the masks 114A, 114B, 114C, and 114E to exclude their output from the signature register 118. Then, once the scan channel 112D outputs to the signature register 118, then the mask 114D may be intermittently activated to isolate an aperture 122 (explained further in FIG. 3). An aperture 122, may be a region of a scan channel 112 that is isolated. The aperture 122 may work in conjunction with the mask 114 and may isolate more than one set of latches across multiple scan channels 112. The logic elements in the testing region 120 may be further tested. For example, if the testing region 120 reports a fault in the logic elements, then the tester may undertake additional scans. In another embodiment, the masks 114 may activate to isolate scan channels 112. For example, the mask 114B, 114C, 114D, and 114E may activate so that the signature register 118 just receives the results from the input 110, i.e., test vector, to scan channel 112A.

The controller 116 may control the masks 114 to ensure that only unmasked scan channels 112 or scan latches are recorded in the signature register 118. The masks 114 are shown as connected in series to the controller 116 for illustrative purposes and each mask 114 may be controlled separately. The controller 116 or masks 114 may also receive timing signals from a clock.

Figure 2:
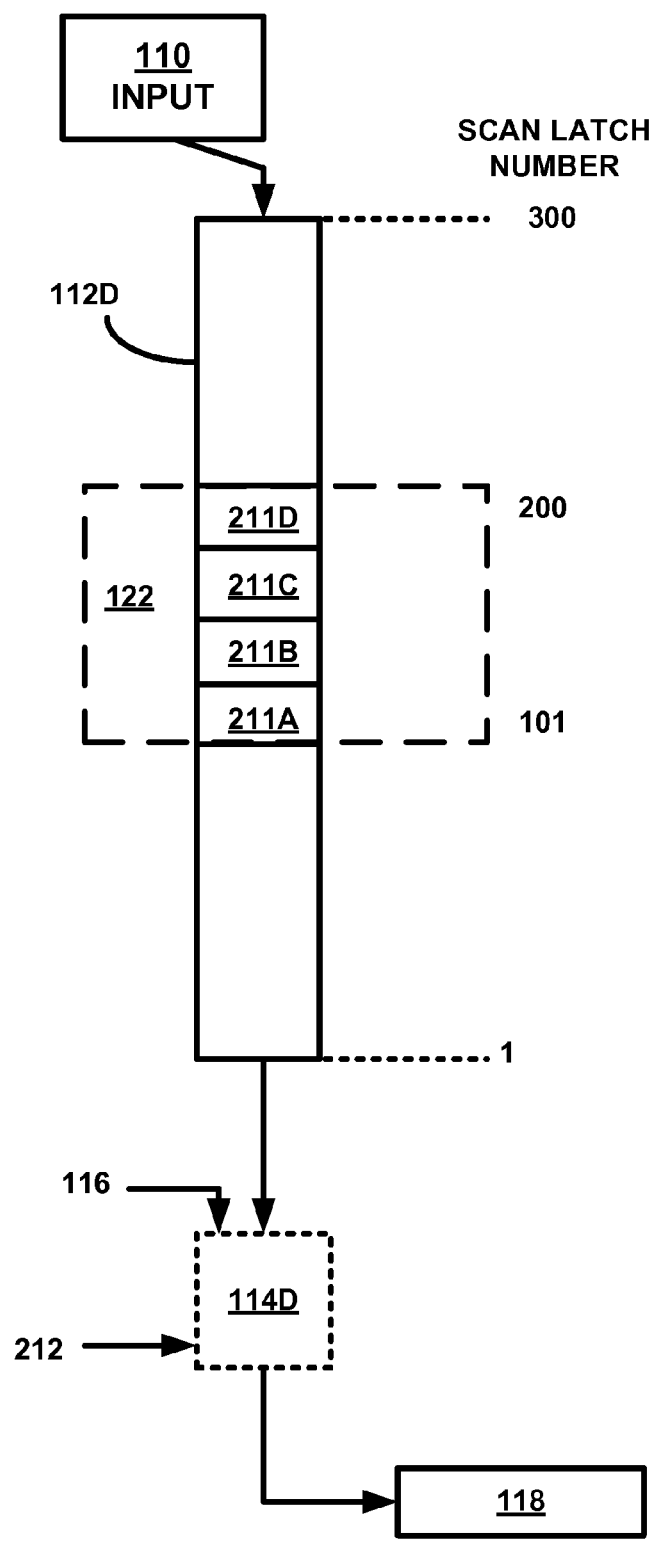
FIG. 2 illustrates an isolated scan channel where scan latches outside of an aperture are masked, according to an embodiment.

FIG. 2 shows an example of an isolated scan channel 112D with 300 scan latches according to an embodiment. The scan channel 112D may be isolated by masking off scan channels 112A, 112B, 112C, and 112E, according to some embodiments. The number of scan latches used is for illustrated purposes and different numbers of scan latches are contemplated. The scan channels 112A, 112B, 112C, and 112E may be entirely masked off in this embodiment. In the double-level or triple-level sweep (discussed below), the aperture 122 may divide the scan channel 112D into segments 211A, 211B, 211C, and 211D, which may contain an equal or unequal number of scan latches. In the shown embodiment, the segments 211A, 211B, 211C, and 211D may each contain 25 scan latches. In other embodiments, there may be an unequal number of scan latches. For example, segment 211A may contain 50 scan latches, segment 211B may contain 20 scan latches, segment 211C may contain 5 scan latches, and segment 211D may contain 15 scan latches.

The scan channel 112D may receive a test vector from an input 110, which may be transmitted into the scan latches. The scan channel 112D may couple with the mask 114D. The mask 114D may receive a control signal from the controller 116 to activate or deactivate the mask 114D. The mask 114D may receive the signal from a clock 212 which may cause the mask 114D to activate to, for example, exclude scan latches 1 through 100 from the signature register 118. The mask 114D may also deactivate to include scan latches 101 through 200 into the signature register 118 and activate to exclude scan latches 201 through 300.

Figure 3:
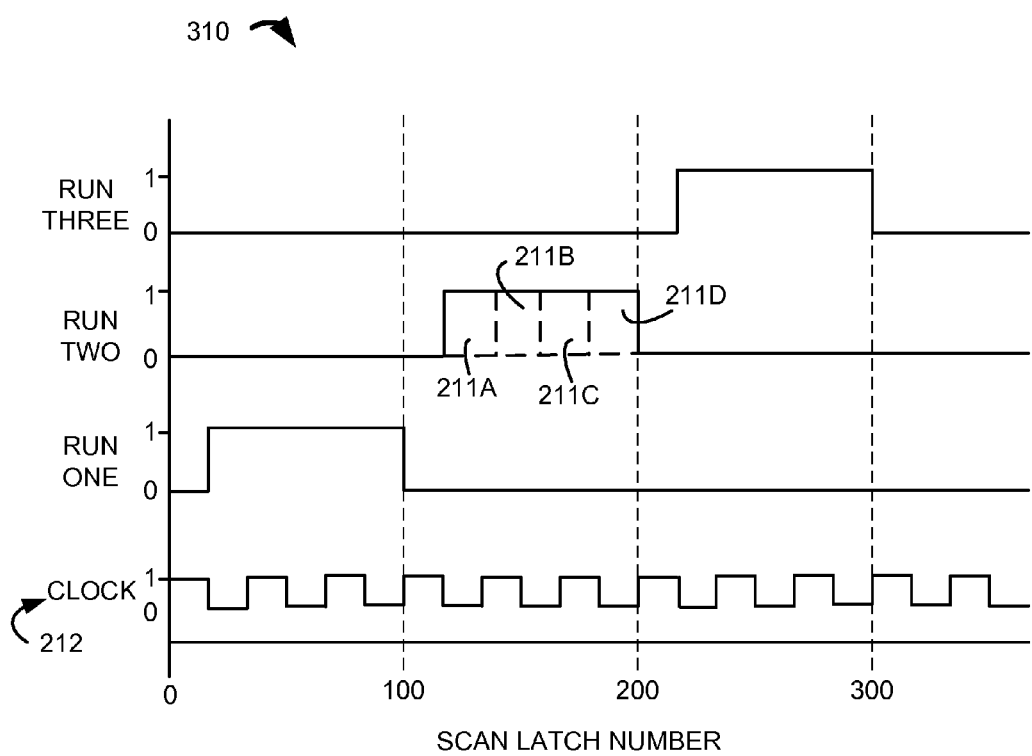
FIG. 3 shows a signal graph that illustrates the activation of the aperture in FIG. 2, according to an embodiment.

FIG. 3 illustrates the control signals 310 that may be provided by the controller 116 in FIG. 2, according to an embodiment. The test vector results for particular scan latches may be received by the signature register 118 based on the control signal 310 received by the mask 114D. The mask 114D may receive a clock signal 212. The runs may be timed based on the clock signal 212 received by the mask 114D. For example, the test vector results from the scan channel 112D may be received by the signature register 118. In the example shown on FIG. 2, the mask 114D may receive test signals in Run Two which would mask scan latch 1 through 100 and 201 through 300. The result from segments 211A, 211B, 211C, and 211D may enter the signature register 118 and the result may be compared to the result in a signature register in the good chip. If the segments 211 are all the same as in the good chip, i.e., passing, then the fault is not in scan latch numbers 101 through 200. If the result of the scan indicates a fault, then there may be at least one fault in scan latches 101 through 200. This fault may be later identified in subsequent runs.

The scanning of the scan channel 112D may be performed in three separate runs. For example, at scan latch 1 to 100, the test vector may be received at input 110 and applied to the scan channel 112D. The controller 116 may activate Run One on the mask 114D by signaling a mask "off" signal. The mask 114D may allow the test vector results from scan latches 1 to 100 into the signature register (while excluding scan latches 101 to 300) to be compared with the same scan latches from a good chip by comparing the signature register value on the good chip with the signature register on the failing, or bad chip, according to various embodiments. Runs for scan latches 101 through 300 may be received by the signature register 118 in a similar manner. In some embodiments, a delay between the clock signal 212 and the initiation of a controller signal 116 may be present between the various runs to compensate for any delays in processing time in the tester. A fault detected in any of the runs may help the tester to isolate the failing latches while "skimming" the testing of good logic elements.

Different masking patterns may be necessary to identify the specific scan latch that causes the fault and balance the speed of the test with the test coverage of the test vector. Masking patterns may include n-level masking patterns, or sweeps. The n value may correspond to 1 (single), 2 (double), or 3 (triple) at one end of the spectrum and extend to a recursive binary sweep at another end of the spectrum. Other values for n are also contemplated such as 4, or 5. The limit for n may depend on the number of logic elements, according to various embodiments.

In one embodiment, the sweep, or masking pattern, may be performed through a single-level sweep. In a single-level sweep, all except one scan channel, e.g., scan channel 112D, or all except one latch in a scan channel are masked and do not contribute to the signature register 118. For example, in a single-level sweep, scan channels 112A, 112B, 112C, and 112E may be masked and scan channel 112D may be masked at every latch, instead of every 100 latches as in the example in FIG. 2. In the above example, the number of runs would be equivalent to the number of scan latches.

In another embodiment, the sweep, or masking pattern, may be performed through a double-level sweep as in the example in FIG. 2. The double-level sweep may divide a scan system 100 with one or more scan channels 112 into a number of segments that may have a number of scan channels 112 per segment, which may be referred to as a MISR sweep. In another embodiment, the double-level sweep may divide a scan channel into a number of segments that may have a number of scan latches, which may be referred to as a scan channel sweep. A segment that passed does not contain any scan channels or latches with faults. Any segment with faults must contain at least one failing logic element. The number of individual logic elements to include in each segment may be calculated for peak efficiency. Using the example in FIG. 2, the double-sweep method may be implemented by the controller 116 by masking scan latches from scan channel 112D so that 100 scan latches are received by the signature register 118 at a time. Assuming that only an aperture of scan latches 101 through 200 have faults, the scan latches 101 through 200 may be further broken down into segments 211A, 211B, 211C, and 211D, which may have 25 scan latches each. A fault may be determined by scanning the segments 211. For example, if faults are found on segments 211A, but not 211B, 211C, or 211D, then the controller 116 may be able to scan individual scan latches on subsequent runs.

In another embodiment, a triple-level sweep may be performed. The triple-level sweep may divide the total set into segments like in the double-level sweep. The segments may be further broken down into subsegments. A number of individual logic elements may make a subsegment. Faults may be identified at both the segment level and subsegment level. An example of the triple-level sweep may be if the example of the double-level sweep above has a fault in a segment, e.g., segment 211A. In a triple-level sweep, the segment 211A may be further divided into subsegments, which may contain individual latch numbers, e.g., 101-125, and the other segments, e.g. segments 211B, 211C, and 211D, may be masked off. The triple-level sweep may be performed with a MISR sweep or a scan channel sweep, according to various embodiments.

In another embodiment, the sweep, or masking pattern, may be performed by a recursive binary sweep. The recursive binary sweep may divide the segments by two. The number of segmentation levels may be determined by the number of scan latches. The scan channel may be continuously divided by two until each segment contains individual logic elements. For example, in the embodiment shown in FIG. 2, the scan latches 1-150 would form a segment, and the scan latches 151-300 would form another segment and subsequent segments would divide by two until a segment contains a single scan latch. A test vector may be applied to a particular segment, and the result would generate a result transmitted to the signature register 118. The signature register 118 from the test chip would be compared to the signature register from the good chip.

The number of segments may depend on whether there is a fault on a particular segment. For example, if a first segment with scan latches 1-150 has a fault, but a second segment with scan latches 151-300 does not, then the first segment may be divided into two additional segments in subsequent runs until the faults are identified on individual scan latches.

Figure 4:
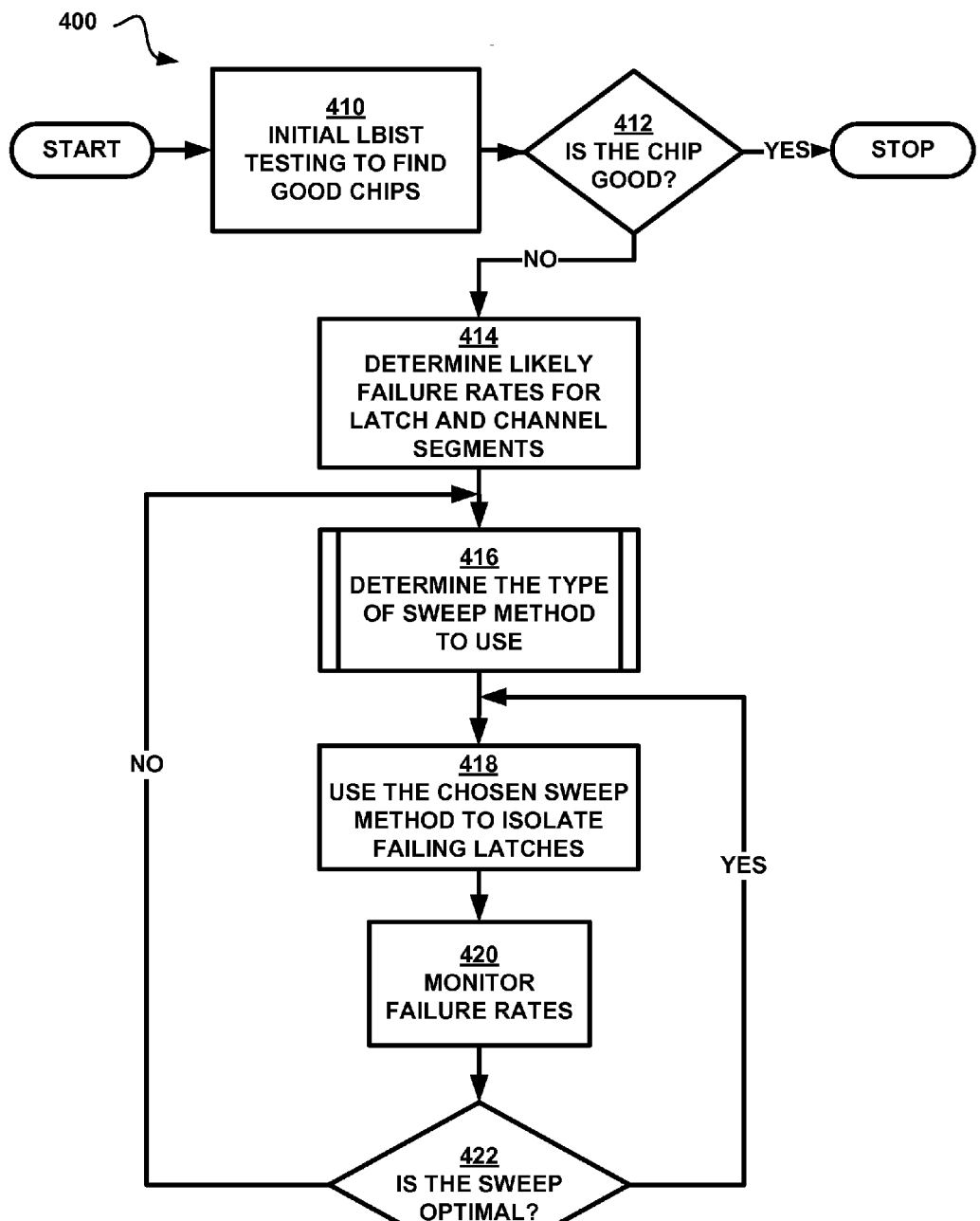
FIG. 4 illustrates a flowchart of the operation of the testing system in FIG. 1, according to an embodiment.

FIG. 4 illustrates an exemplary method 400 of determining the type of sweep method to use for the masking function, according to an embodiment. In operation 410, the tester may determine average failure rates of the chip when finding good chips. For example, if 100 chips are tested and only five are found to fail (i.e., the value in signature register 118 does not match the simulated value) the average failure rate is low. If 100 chips are tested and 95 are found to fail, the average failure rate is high. In operation 410, the good chip may be determined by comparing the test vector results from all scan channels in the signature register 118 against a predicted (e.g., by simulation) result from the tester.

In operation 412, the tester may locate a good chip. If the good chip is located, the method 400 may continue to search for bad chips and the good chip may be used as a standard for other chips. Once a chip is determined to have faults, i.e., a bad chip, then the method 400 may proceed to operation 414. In operation 414, the failure rates for both scan latches and scan channels may be determined. The failure rates may be derived from the failure rates of previous batches of chips, from a simulation, or may be estimated by the tester. If the tester is not able to estimate the failure rate for the scan latch, then operation 414 may proceed and use the single-level or recursive binary sweep (further discussed in operation 416) to determine the actual failure rate for a scan latch or scan channel for the batch of chips. Operation 414 and operation 410 may be part of the same operation and may continue to operation 416. In operation 416, the controller 116 may determine the type of sweep method to use (discussed further in FIG. 5) and may continue to operation 418.

In operation 418, the tester may direct the controller 116 to implement the selected sweep method to isolate the failing scan latches in the fewest number of runs. The tester may continuously refine the determination for the failure rate, according to various embodiments. In operation 420, the tester may monitor the failure rate for the chosen sweep method in subsequent chips. An increasing failure rate, for example, may indicate that a different sweep method may be more optimal. Operation 420 may be skipped depending on the number of chips tested. For example, a small lot size may reduce the need for continuous monitoring of fault distribution. The fault distribution may include how faults are distributed on a chip.

The determination of cost may further be measured relative to the tester time, where a high cost corresponds to a greater amount of tester time. Cost may be defined by the run count, or the amount of time a tester takes for a chip, and may be measured relative to another parameter or a threshold such as tester efficiency. In operation 422, the tester may determine if sweep method is optimal for a failure profile. The failure profile may be influenced by the failure rate of current or subsequently tested chips or by the cost. For example, if the recursive binary sweep was optimal for 3 chips, but the failure rate of the fourth chip is higher, then the failure profile has changed. In this example, the tester may evaluate where the faults are in the fourth chip to determine if the sweep method used is optimal.

It will be understood that "three chips" and a "fourth chip" are used for explanation and could just as easily have been "thirty chips or three hundred chips" for a first number of chips being tested, and "ten chips, forty chips or other number of chips where the sweep method then appears to be non-optimal. The tester may check for optimal usage using methods, e.g., simulations, relative cost, or cost in comparison to a threshold. If the sweep method is not optimal, then the operation may proceed to operation 416, where the sweep method is reevaluated. If the sweep method is optimal, then the operation 422 may proceed to operation 418 where subsequent chips may be monitored.

Figure 5:
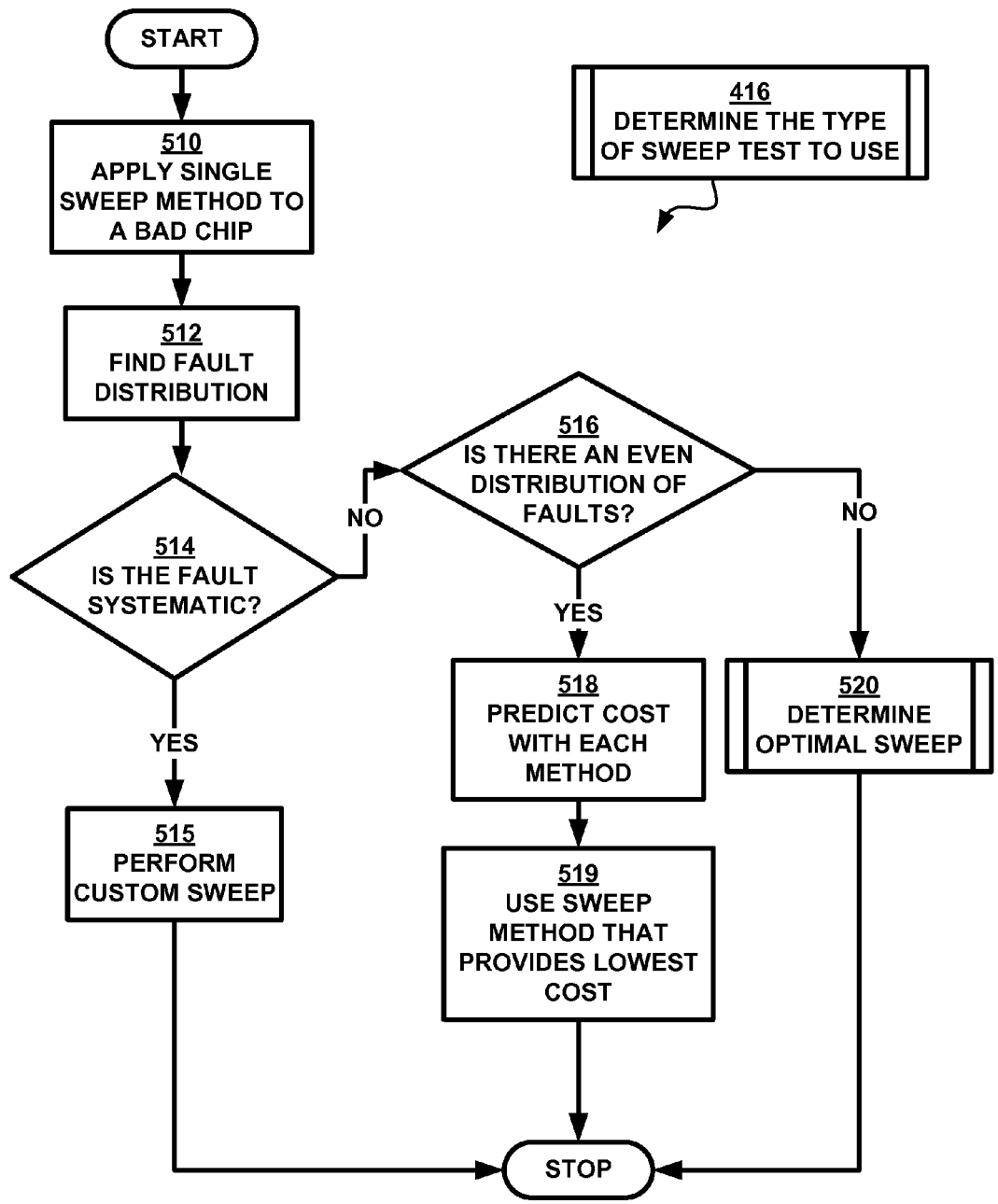
FIG. 5 illustrates a flowchart of selecting a sweep method for the testing system, according to an embodiment.

FIG. 5 illustrates an exemplary flowchart an embodiment of the operation 416 depicted in FIG. 4. The operation 416 may start with operation 510 where the tester may apply the single-level sweep to each scan channel of the chip and output the test results to the signature register 118. The signature register 118 may be compared to a signature register for a good chip. In one embodiment, the tester may apply the single-level sweep to a chip. In another embodiment, the tester may apply the single-level sweep to a plurality of chips, which may, e.g., allow the tester to examine fault distribution in operation 512. In operation 512, the tester may examine certain areas of the chip to determine fault density or may examine the number of consecutive faults. For example, an even distribution of faults may indicate that the fault distribution is random. In other embodiments, a random distribution of faults may exist where there is an equal probability of faults in every scan channel.

In operation 514, the tester may determine if a number of factors exist, e.g., if the fault is systematic, if the fault has an even distribution, if the faults are concentrated. If the tester determines that the fault is systematic, then the operation may proceed to operation 515. A systematic fault may exist, e.g., if faults are concentrated in a certain area of the chip throughout multiple chips. If the tester determines that the fault is non-systematic, then the operation may proceed to operation 516.

Operation 515 may involve selecting different aperture or segment sizes for logic elements. For example, if the distribution of faults is concentrated around scan latches 2-6 in 112D in FIG. 2 throughout 4 chips, then the tester may group scan latches 50-300 into a run and 0-50 into another run. In another embodiment, the tester may be configured to use a same segment length for all scan latches. For example, if the fault distribution is concentrated around scan latches 2-6, then the tester may use a segment length of 10. In another embodiment, the runs may be simulated by the tester.

In operation 516, the tester may analyze the chip to determine if there is an even distribution of faults. An even distribution of faults may be interpreted to refer to a uniform distribution of faults across a chip, or a random distribution of faults. The term "random distribution" may be used interchangeably with "even distribution" in some embodiments. A random distribution of faults may occur if each logic element in a chip has an equal probability of having a fault. A random distribution of faults may occur when there is not a systematic fault, e.g., where the faults are distributed among the logic elements in no particular pattern. If the tester determines that there is an even distribution of faults, then the operation may proceed to operation 518. In operation 518, the tester may predict the cost, e.g., run count, or tester time, with a variety of masking methods, e.g., single-level sweep, double-level sweep, triple-level sweep, or binary recursive sweep. The tester may determine the number of runs, or run count using the failure rate of the scan latches, the number of scan latches per scan channel, and the number of scan channels.

In one embodiment, the tester may determine the run count for the double-level sweep using a determination method. The determination method may determine the number of runs using either a signature register sweep or a scan channel sweep. In some embodiments, the term Multiple Input Signature Register (MISR) sweep may refer to a signature register sweep, e.g., signature register 118, where a group of scan channels in a MISR may be masked and their results recorded by the signature register 118 before sweeping individual scan channels 112. For example, in a chip of 50 scan channels, a masking pattern may group scan channels into segments of 5 scan channels and apply a test vector to one segment at a time to isolate failing latches. A scan channel sweep may be a sweep of the latches within a scan channel 112. In the following example, a scan channel sweep will be illustrated. The determination method may determine the run count by using the following equation:

$$Runstotal = \frac{s}{n} + n(f_{average}),$$

where s is the total number of scan latches, n is the number of groupings of scan latches, or segments, and $f_{average}$ may be determined. $f_{average}$ may be a measure of the failure rate of an individual scan channel, according to some embodiments. $f_{average}$ may be determined based on the following equation:

$$f_{average} = 1 + f_{segment}\left(\frac{s}{n} - 1\right),$$

where s is the total number of scan latches, n is the number of segments, and $f_{segment}$ is the failure rate of a segment. The failure rate of the segment may be determined by the following equation: $f_{segment} = 1 - (1 - f_{channel})^n$, where $f_{channel}$ is the failure rate of the scan channel, and n is the number of segments in a scan channel. The tester may determine $f_{channel}$ in a similar manner by using the following equation: $f_{channel} = 1 - (1 - f_{latch})^n$, where n is the number of scan latches in a scan channel, and f is the failure rate of the scan latches. The tester may determine the number of groups of scan latches, or segments using the following equation:

$$1 - (1 - f_{channel})^n = \left(\frac{s}{n} - n\right)(s - n),$$

where n is the total number of segments in a scan channel, s is the number of scan latches, and $f_{channel}$ is the failure rate of the scan channels.

In other embodiments, the tester may determine the run count for the triple-level sweep in a similar manner. The total number of expected runs may be calculated using the equation:

$$Run_{total} = \frac{s}{n^2} + nf_{pass1} + nf_{pass2},$$

where n is the number of segments in a scan channel, or the number of groups of scan latches, $f_{pass1}$ and $f_{pass2}$ are the failure rates of the first and second segments. The variables $f_{pass1}$ and $f_{pass2}$ may be determined by the equations:

$$f_{pass1} = 1 + f_{firstsegment}\left(\frac{s}{n^2-1}\right), \text{ and } f_{pass2} = 1 + f_{secondsegment}\left(\frac{s}{n}-1\right),$$

where $f_{firstsegment}$ is the failure rate for the first segment, $f_{secondsegment}$ is the failure rate for the second segment, s is the number of scan latches, and n is the number of segments. The variables $f_{firstsegment}$ and $f_{secondsegment}$ may be determined by the following: $f_{firstsegment}=1-(1-f_{scanchannel})^{n^2}$ $f_{secondsegment}=1-(1-f_{scanchannel})^n$, where $f_{scanchannel}$ is the failure rate of the scan channel, and n is the number of segments. Here, the number of segments in a scan channel may be estimated using the following equation:

$$\frac{\frac{s}{n^2}-n}{s-n} = 1-(1-f_{Latch})^n,$$

where n is the number of segments, s is the number of scan latches in a scan channel, and $f_{latch}$ is the failure rate of a scan latch.

After the cost for each method is determined, the sweep that provides the lowest cost to the tester may be selected in operation 519. Once operation 519 is completed, the operation may continue to operation 420 of FIG. 4. If the distribution of faults is not even, then the tester may further determine the optimal sweep in operation 520.

Figure 6:
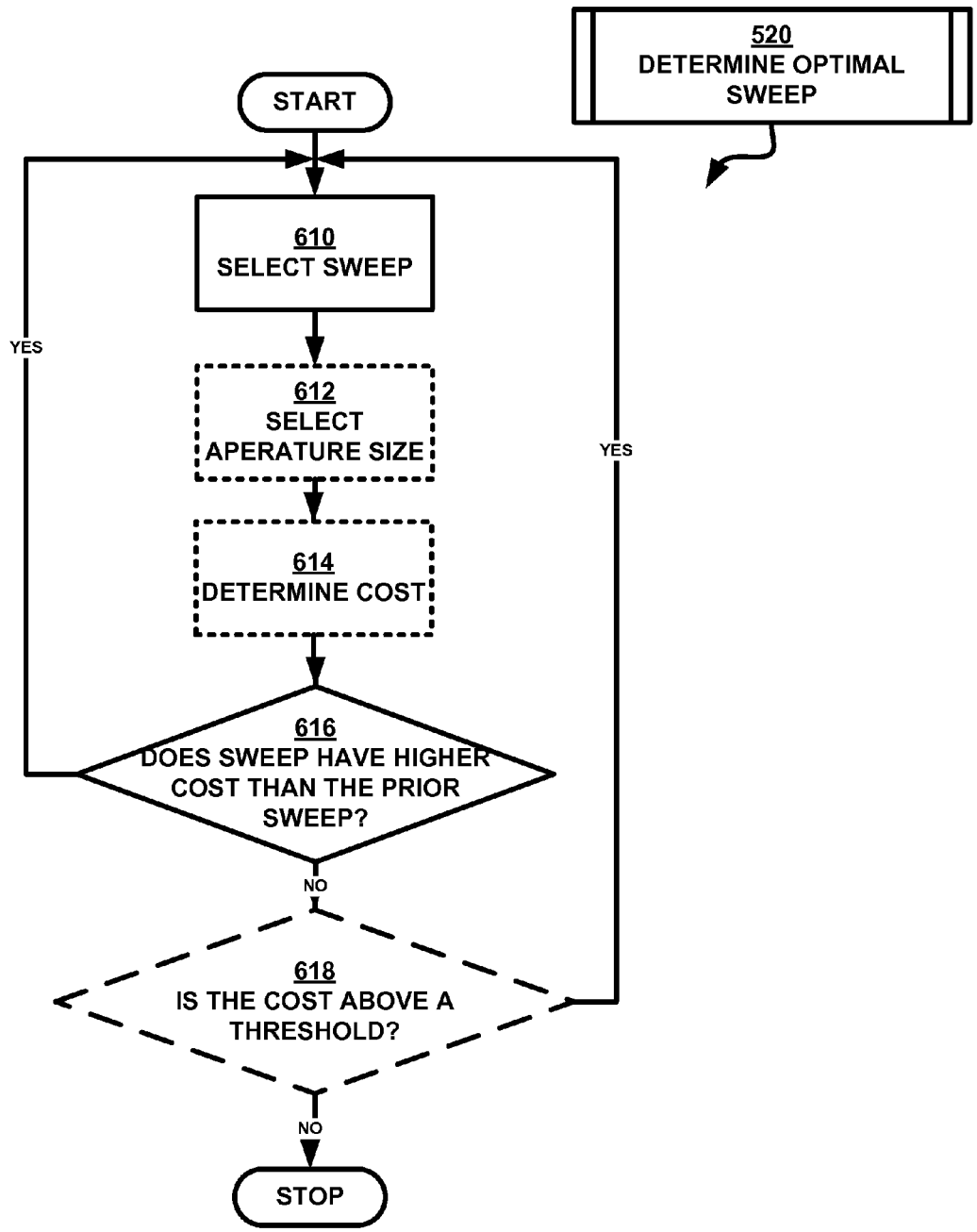
FIG. 6 illustrates a flowchart of the method of determining an optimal sweep method for the testing system, according to an embodiment.

FIG. 6 illustrates an exemplary flow chart of an embodiment of operation 520 in FIG. 5. Operation 520 may start in operation 610 and may "experiment" with different aperture sizes to determine the optimal sweep for subsequent chips. The optimal sweep may contain a lower cost to the tester. In operation 610, the tester may select the sweep to perform. Since the number of runs of a single-level scan may be based on the number of scan latches, and scan channels, operation 610 may start with selecting a sweep such as a double-level sweep. In this example, the method 520 may start with the double-level sweep. The selection of sweeps may occur arbitrarily or based on a predetermined cycle of sweeps, e.g., selecting the double-level, then the triple-level, then the recursive binary. Once a sweep is selected, the operation may continue to operation 612. In operation 612, the tester may select the aperture size since the double-level sweep is used in this example. In other embodiments, aperture size may not be determinative or relevant, e.g., recursive binary sweep.

When the aperture size is selected, the tester may scan the scan channels using the selected aperture size. In the double sweep method, the aperture size may be related to the number of segments and the segments have each faulty scan latch received into the signature register 118. When the aperture size is selected, the tester may use the aperture size in the sweep method. The tester may determine the cost in operation 614 by recording the number of runs that the tester used to perform the sweep. The tester may, in operation 616, determine if the sweep would have a higher cost, i.e., use more runs, than a prior sweep or aperture size. In this example, the double-level sweep may be compared to a single-level sweep. If there is no prior sweep, then the operation 616 may be avoided or compared to the single-level sweep obtained in operation 510. If the currently used sweep takes longer than a prior sweep, the prior sweep may be selected in subsequent chips.

In another embodiment, the tester may determine if the cost is above a threshold for the tester in operation 618. If yes, then run the test on the chip using a different sweep method or change the aperture size. For example, if the number of runs obtained from a particular sweep method, e.g., the double-level sweep, is 4300 runs, and the threshold for the tester is 4000 runs, then the tester may select another aperture size and repeat the analysis until the double-level sweep is below the threshold or select another sweep method. If the number of runs is below the threshold, the tester may use the selected sweep method and aperture in other chips and the operation 416 may cease. In other embodiments, the tester may bypass operation 618 and record the number of runs for that particular configuration and select a different sweep or aperture size in a subsequently tested chip. Operation 618 may proceed to operation 422 in FIG. 4.

Figure 7:
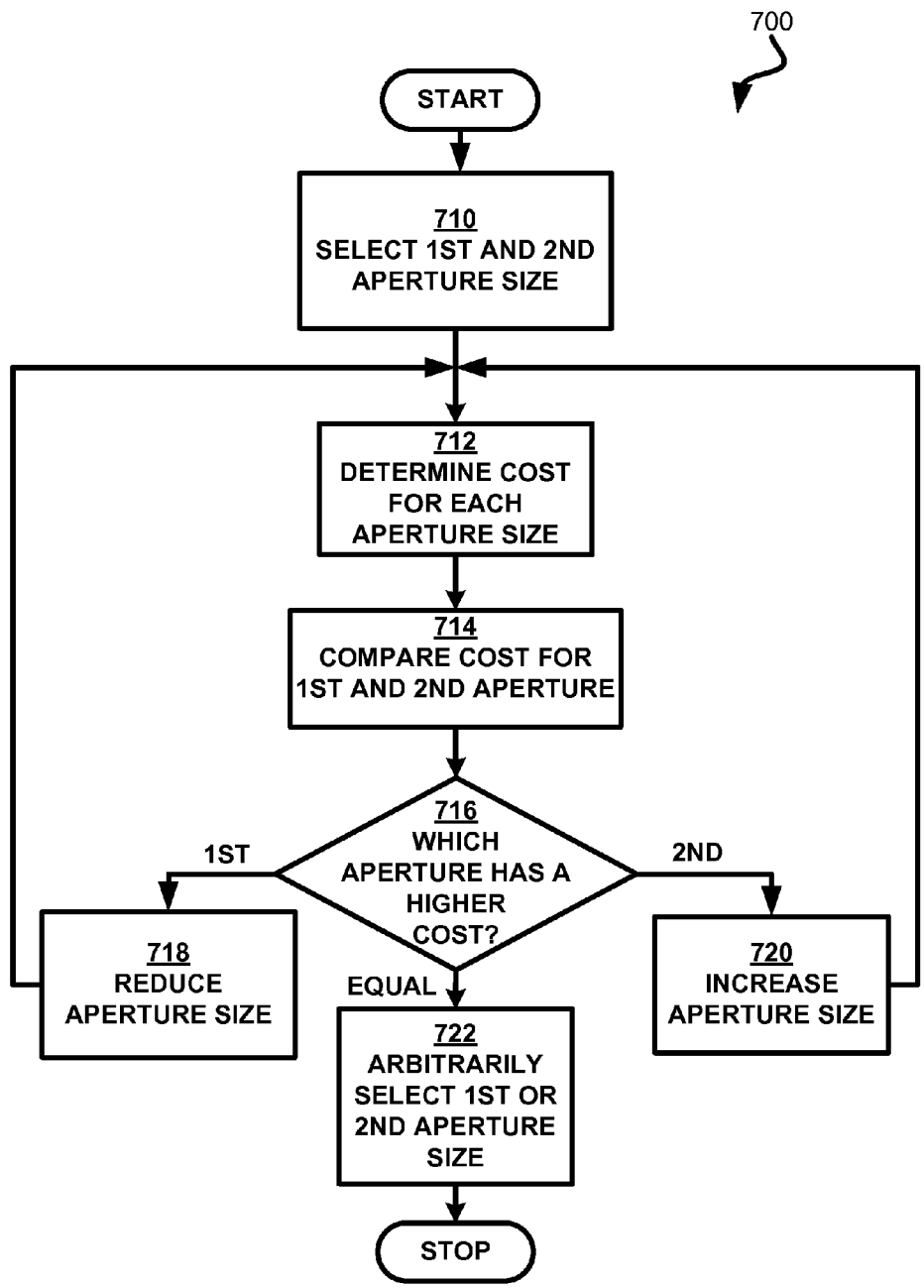
FIG. 7 illustrates a flowchart of selecting an optimal aperture size for the testing system, according to an embodiment.

FIG. 7 illustrates an exemplary method 700 of selecting the aperture size for the double-level and triple-level sweep in operation 616 and operation 618 in FIG. 6, according to an embodiment. The method may start with operation 710. In operation 710, the tester may select the double-level or triple-level sweep, or any other sweep that depends on the aperture size. The tester may use two apertures, a first aperture and a second aperture, with the first aperture being larger than the second aperture. In operation 712, the tester may determine the cost for each aperture size. The cost for the two aperture sizes may be simulated, projected, or may be based on results from prior chips or sweeps. In operation 714, the tester may compare the cost for the first and second aperture and the operation may proceed to operation 716. In operation 716, the tester may determine which aperture has a higher cost. If the first aperture has a higher cost, then the operation proceeds to operation 718. If the second aperture has a higher cost, then the operation proceeds to operation 720. If the cost between the first and second aperture are equal, then the operation proceeds to operation 722.

In operation 718, the tester may make the first aperture size equal to the second aperture size, thus reducing the size of the first aperture. The second aperture size may also be reduced and the operation may proceed to operation 712. In operation 720, the second aperture size may be increased so that it is equal to the size of the first aperture. The first aperture size may also be increased and the operation may proceed to operation 714. In operation 722, since the costs for both the second and first aperture are equal, then either the first aperture or second aperture size may be selected. This may occur randomly or one aperture may be chosen as the default, but other configurations are contemplated. After an aperture size is selected, the operation may proceed to operation 616. In other embodiment, the operation may proceed to operation 418 in FIG. 4, but other configurations are contemplated. It will be appreciated that method 700 effectively "follows the derivative" of cost versus aperture size to determine whether to make the aperture larger or smaller for lower cost. In one embodiment, the derivative of cost may be the impact of the aperture size on the cost.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A system for locating faulty logic on a semiconductor chip comprising:
    a scan channel having a plurality of logic elements that receive a test vector, generate a test vector result, and output the test vector result;
    a mask coupled to the scan channel and configured to control the test vector result based on a masking pattern; and
    a tester configured to:
        transmit the test vector to the scan channel;
        receive the test vector result from the scan channel;
        determine the masking pattern as a function of a failure rate of one or more faulty logic elements of the plurality of logic elements;
        implement the masking pattern using the mask; and
        compare the test vector result to a reference result based on a good chip.

2. The system of claim 1, wherein the masking pattern activates the mask on logic elements of the plurality of logic elements and other than the one or more faulty logic elements.

3. The system of claim 1, wherein the tester is further configured to compare test vector results corresponding to a segment including multiple logic elements and generate a masking pattern for the segments in response to the comparison.

4. The system of claim 1, wherein the tester is configured to determine the masking pattern by determining a first cost based on scans that use a logic element and a first masking pattern and a second cost based on scans that use the logic element and a second masking pattern, and selecting the first masking pattern in response to the first cost being below the second cost.

5. The system of claim 1, wherein the tester is configured to refine the determined masking pattern by determining a cost for a first aperture size and a second, different aperture size, comparing the cost for the first aperture size and the second aperture size, and changing aperture size in a direction indicated by an impact of the aperture size relative to the costs.

6. The system of claim 5, wherein the impact of the aperture size is measured by the cost.

7. The system of claim 4, wherein the cost is determined by a tester time.

8. The system of claim 4, wherein the cost is determined by tester efficiency.

9. The system of claim 4, wherein the cost is determined by a number of test vector results used to identify a fault in the logic element.

10. The system of claim 1, wherein the masks is configured to transmit the test vector result to a signature register.

* * * * *